US006767757B2

(12) United States Patent
Kang et al.

(10) Patent No.: US 6,767,757 B2
(45) Date of Patent: Jul. 27, 2004

(54) HIGH-VACUUM PACKAGED MICROGYROSCOPE AND METHOD FOR MANUFACTURING THE SAME

(75) Inventors: Seok-jin Kang, Suwon (KR); Youn-il Ko, Incheon (KR); Ho-suk Kim, Seoul (KR)

(73) Assignee: Samsung Electronics Co., Ltd., Suwon-si (JP)

( * ) Notice: Subject to any disclaimer, the term of this patent is extended or adjusted under 35 U.S.C. 154(b) by 0 days.

(21) Appl. No.: 10/387,541

(22) Filed: Mar. 14, 2003

(65) Prior Publication Data

US 2003/0132493 A1 Jul. 17, 2003

Related U.S. Application Data

(62) Division of application No. 09/702,846, filed on Nov. 1, 2000.

(30) Foreign Application Priority Data

Nov. 1, 1999 (KR) .............................. 99-47965

(51) Int. Cl.[7] .............................................. H01L 21/00
(52) U.S. Cl. ............................. 438/48; 438/51; 438/456
(58) Field of Search .............................. 438/48, 51, 52, 438/53, 455, 456

(56) References Cited

U.S. PATENT DOCUMENTS 5,216,490 A * 6/1993 Greiff et al. ............. 73/514.35
5,668,033 A 9/1997 Ohara et al.
6,109,113 A 8/2000 Chavan et al.
6,252,229 B1 6/2001 Hays et al.
6,391,673 B1 * 5/2002 Ha et al. .................. 438/51

FOREIGN PATENT DOCUMENTS

EP 0722045 A1 5/1997

* cited by examiner

Primary Examiner—Tuan H. Nguyen
(74) Attorney, Agent, or Firm—Burns, Doane, Swecker & Mathis, L.L.P.

(57) ABSTRACT

A high-vacuum packaged microgyroscope for detecting the inertial angular velocity of an object and a method for manufacturing the same. In the high-vacuum packaged microgyroscope, a substrate with an ASIC circuit for signal processing is mounted onto another substrate including a suspension structure of a microgyroscope in the form of a flip chip. Also, the electrodes of the suspension structure and the ASIC circuit can be exposed to the outside through polysilicon interconnection interposed between double passivation layers. The short interconnection between the suspension structure and the ASIC circuit can reduce the device in size and prevents generation of noise, thereby increasing signal detection sensitivity. In addition, by sealing the two substrates at low temperatures, for example, at 363 to 400° C. using co-melting reaction between metal, for example, Au, and Si in a vacuum, the degree of vacuum in the device increases.

7 Claims, 8 Drawing Sheets

HIGH-VACUUM PACKAGED MICROGYROSCOPE AND METHOD FOR MANUFACTURING THE SAME

This application is a divisional of application Ser. No. 09/702,846, filed on Nov. 1, 2000, now U.S. Pat. No. 6,559,487, which claims the priority of Korean Patent Application No. 99-47965, filed on Nov. 1, 1999, in the Korean Intellectual Property Office, the disclosure of which is incorporated herein in its entirety by reference.

BACKGROUND OF THE INVENTION

1. Field of the Invention

The present invention relates to a microgyroscope for detecting an inertial angular velocity of an object and a method for manufacturing the same, and more particularly, to a high-vacuum packaged microgyroscope in which a suspension structure is vacuum packaged at the wafer level and signal processing circuitry integrated therein can be interconnected in the form of a flip chip to external circuitry, and a method for manufacturing the same.

2. Description of the Related Art

FIG. 1 illustrates a conventional integrated micro pressure sensor manufactured by anodic bonding. The integrated micro pressure sensor in FIG. 1 includes a first glass plate 1 as an anodic bonding frame, a silicon substrate 2, a first p$^+$-layer 3 as a vibrating plate for sensing a pressure variation, a second p$^+$-layer 4 as an electrode for measuring a reference electrostatic capacitance, a first metal electrode 5 for sensing an electrostatic capacitance change, a second metal electrode 6 for measuring a reference electrostatic capacitance, an ASIC circuitry area 7 for processing a variety of signals, a getter 8 for adsorbing gases to decrease the inner pressure near to vacuum levels, a conductive epoxy resin (not shown) for interconnection to external circuitry, and a second glass plate 10 as another anodic bonding frame. The first and second glass plates 1 and 10, between which the micro pressure sensor structure formed on the silicon substrate 2 is interposed, serves as a vacuum case, and is evacuated to a pressure of $10^{-6}$ torr, thus producing a vacuum, which allows the micro pressure sensor to operate with high accuracy. The micro pressure sensor structure includes a first capacitor structure for sensing a variable electrostatic capacitance, which includes the first p$^+$-layer 3 formed of the silicon substrate 2 and the first metal electrode 5 deposited on the second glass plate 10, and a second capacitor structure for sensing a reference electrostatic capacitance change, which includes the second p$^+$-layer 4 formed of the silicon substrate 2 and the second metal electrode 6 deposited on the second glass plate 10. The first p$^+$-layer 3 of the first capacitor structure vibrates in accordance with external pressure, thus causing the gap between itself and the first metal electrode 5 to vary. Hence, the electrostatic capacitance changes depending upon the pressure applied to the first p$^+$-layer 3. Meanwhile, the second p$^+$-layer 4 of the second capacitor structure remains still without vibration, so that the gap between itself and the second metal electrode 6 remains constant, and thus the electrostatic capacitance does not change. Changes in the electrostatic capacitance of the first capacitor structure are measured with respect to the reference electrostatic capacitance of the second capacitor structure, thus enabling measurement of small changes in pressure. The getter 8 is a gas adsorbing material for evacuating the space between the first and second glass plates 1 and 10.

Such a micro pressure sensor operates very accurately in a strong vacuum. The same principle can be applied to microgyroscopes. In addition, microgyroscopes along with their associated signal processing circuitry must be small enough to be used in, for example, camcorders, 3D-mouses for Internet TV, automatic navigation systems and the like. This requirement is a limiting factor in most micro sensors as well as microgyroscopes. For various electrostatic capacitive sensors in which vibration of a microgyroscope enables the sensors to operate, vacuum packaging of the suspension structure is needed for decreased driving voltage of the circuit and increased sensitivity. One of the many approaches for satisfying the need has been to use glass-to-silicon bonding with an anodic bonding technique, which has been conducted primarily in the Esashi Laboratory in Douhuku University in Japan.

However, such an anodic bonding technique causes contamination of an IC circuit by sodium ions and needs an additional electric field shielding technique for protection of the IC from a high voltage applied during bonding. Therefore, the anodic bonding technique may present a fatal problem in ICs during bonding. In addition, generation of excessive oxygen at bonding sites during bonding hinders the evacuation of the structure, so that there is a room for improvement.

SUMMARY OF THE INVENTION

To solve the above problems, it is an objective of the present invention to provide a high-vacuum packaged microgyroscope and a method for manufacturing the same, in which a substrate with a signal processing ASIC circuit is mounted on another substrate including a suspension structure of a microgyroscope in the form of a 3-dimensional flip, which decreases the area of the device and the length of interconnection between circuits, and the two substrates are vacuum sealed at the wafer level at low temperatures by a co-melting reaction between a metal and silicon.

An aspect of the above object of the present invention is achieved by a high-vacuum packaged microgyroscope comprising: a first substrate including a suspension structure suspended over a groove cavity formed at the center of one surface thereof, and inner and outer electrode pads; and a second substrate including a signal processing circuit for sensing the motion of the suspension structure, an interconnect for extracting electrodes of the signal processing circuit and the suspension structure of the second substrate to the outside, and inner and outer metal/semiconductor composite layers for vacuum sealing the first and second substrates, wherein the first and second substrates are placed such that the suspension structure and the signal processing circuit thereof face each other, and then sealed by co-melting bond between the outer electrode pads and the outer metal/semiconductor composite layers, and between the inner electrode pads and the inner metal/semiconductor composite layers, to form a vacuum space in the groove cavity which receives the suspension structure, so that the first and second substrates are grounded and the electrodes of the suspension structure and the signal processing circuits are extracted to the top of the second substrate through the interconnect.

Preferably, the first and second substrates are formed of silicon. Each of the first and second substrates may further comprise a first passivation layer formed of silicon oxide or nitride to protect the first and second substrates. The suspension structure may be formed of a polysilicon or monosilicon layer. The inner and outer electrode pads of the suspension structures may be formed of a polysilicon layer, a polysilicon/gold (Au) composite layer, or polysilicon/aluminum (Al) composite layer. The interconnect may be formed on both sides and the top and bottom edges of the second substrate surrounded by the first passivation layer, the both sides of the second substrate being formed by presence of through holes, and a second passivation layer is formed on the interconnect for insulation. The outer metal/semiconductor composite layers may be formed on the outer sides of the second passivation layer. Preferably, the degree of vacuum of the groove cavity reaches down to $10^{-6}$ torr. Preferably, the inner and outer metal/semiconductor composite layers are formed of a thin Au/Si or Al/Si composite layer, such that the inner and outer metal/semiconductor composite layers are melted and bonded with the inner and outer electrode pads at a low temperature of 363 to 400° C. to create a vacuum space without causing the formation of voids at bonding sites.

Another aspect of the object of the present invention is achieved by a method for manufacturing a high-vacuum packaged microgyroscope, comprising the steps of: (a) etching a first substrate to form a groove cavity at the center of the first substrate, where a suspension structure is to be formed, and forming a first passivation layer for protecting the first substrate; (b) depositing a polysilicon layer on the etched surface of the first substrate and patterning the polysilicon layer into inner and outer electrode pads; (c) forming a suspension structure by depositing a sacrificial layer over the inner and outer electrode pads, patterning the sacrificial layer to form openings to be anchors for sustaining the suspension structure, depositing polysilicon over the opening and the sacrificial layer and patterning the deposited polysilicon layer; (d) removing the sacrificial layer by etching to float the suspension structure; (e) forming an oxide pattern on a second substrate having a signal processing circuit for sensing the motion of the suspension structure; (f) patterning the second substrate using the oxide pattern as an etching mask to form through holes for interconnection to the outside, removing the oxide pattern, and forming a first passivation layer for protecting the entire surface of the second substrate; (g) forming an interconnect by depositing a polysilicon layer to cover both sides and the top and bottom edges of the second substrate surrounded by the first passivation layer, and patterning the polysilicon layer; (h) depositing a second passivation layer to cover the interconnect and the second substrate and patterning the second passivation layer to form openings for interconnection to the outside; (i) forming inner metal/semiconductor composite layers for connection through the openings to the interconnect, and outer metal/semiconductor composite layer for vacuum packaging on the second passivation layer; and (j) vacuum sealing the first and second substrates by co-melting bond between the inner electrode pas of the first substrate and the inner metal/semiconductor composite layers, and between the outer electrode pads of the first substrate and the outer metal/semiconductor composite layers of the second substrate, to maintain the cavity of the suspension structure in a vacuum condition.

Preferably, in the step (b) the inner and outer electrode pads of the suspension structure are formed of a polysilicon layer, a polysilicon/gold (Au) composite layer, or a polysilicon/aluminum (Al) composite layer. Preferably, in the step (g) the polysilicon is deposited by low pressure chemical vapor deposition (LPCVD). Preferably, in the step (h) the second passivation layer is deposited by plasma enhanced chemical vapor deposition (PECVD). Preferably, in the step (i), the inner and outer metal/semiconductor composite layers are formed of a Au/Si or Al/Si composite layer. Preferably, in the step (j), the melting and bonding are performed at a low temperature of 363 to 400° C., and the degree of vacuum in the cavity reaches down to $10^{-6}$ torr.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

A high-vacuum packaged microgyroscope according to the present invention is constructed such that a substrate with a signal processing ASIC circuit is mounted on another substrate with a suspension structure in the form of a 3-dimensional flip, which can decrease the size of the device and the length of interconnection between circuits, and in turn reduce noise. The two substrates are sealed at low temperature, for example, at a temperature of 363 to 400° C. by a co-melting reaction of metal and silicon, for example, gold and silicon, or aluminum and silicon, in a vacuum. In addition, additional packaging processes such as wire bonding or die bonding are not required, which sharply lowers the manufacturing cost. Also, a reduction in the size of the device in the order of several square millimeters contributes to minimizing all devices in micro system related applications.

Figure 1:
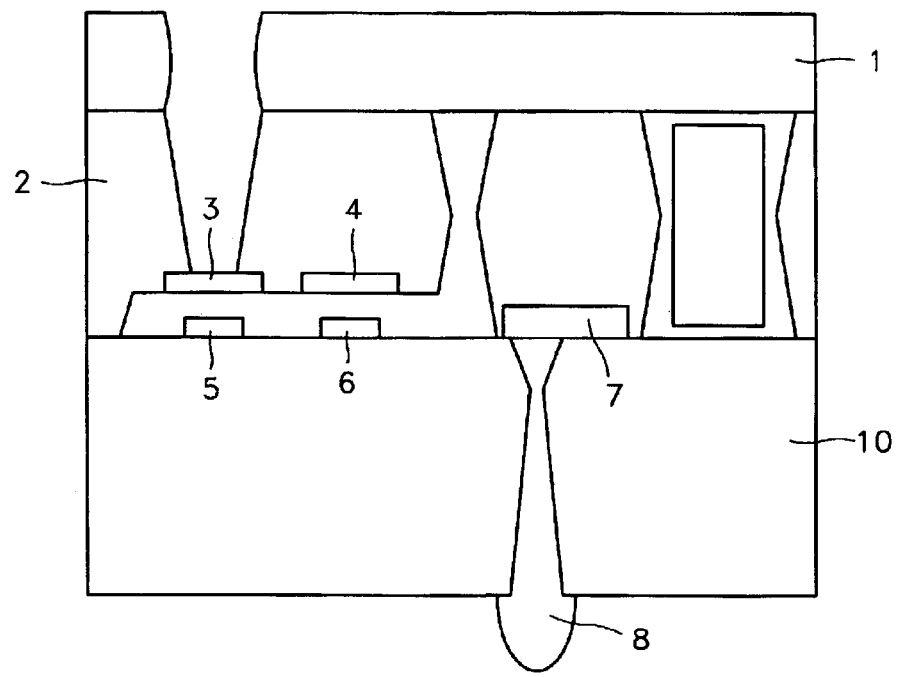
FIG. 1 is a sectional view of a conventional microgyroscope.
Figure 2:
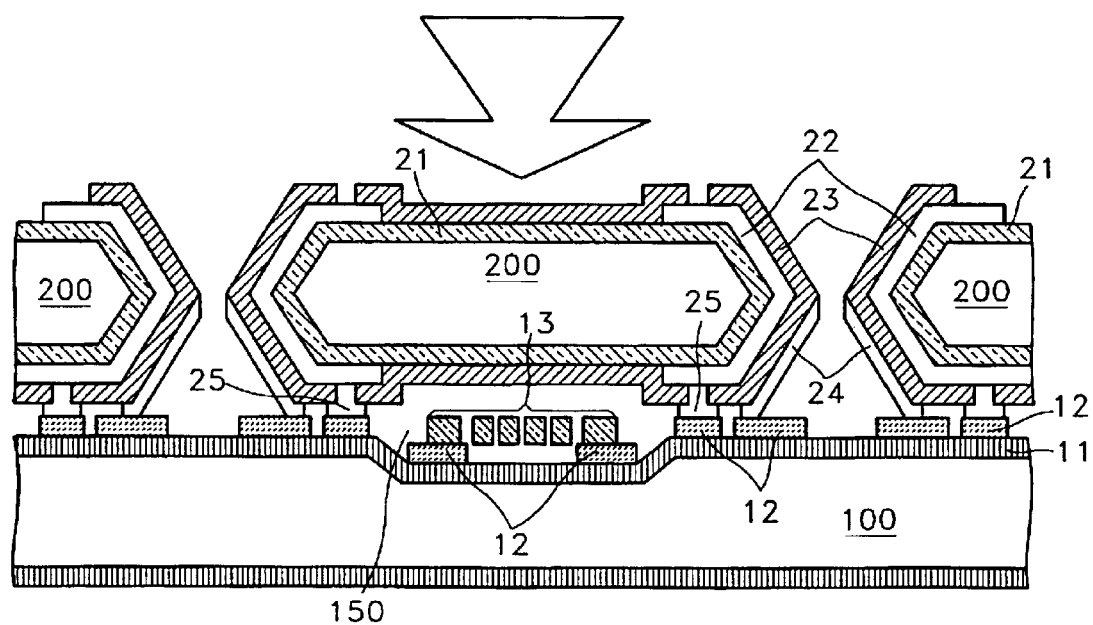
FIG. 2 is a sectional view of a microgyroscope according to the present invention.

FIG. 2 is a sectional view of a high-vacuum packaged microgyroscope according to the present invention. In FIG. 2, the microgyroscope package includes a first substrate (structure wafer) 100 with a suspension structure 13 of a microgyroscope, and a second substrate (cap wafer) 200 with a signal processing circuit (not shown) and a polysilicon interconnection 22 which allows for interconnection to external circuits. The cap wafer 200 acts as a cap for a cavity 150 formed between the first and second substrates 100 and 200. The polysilicon interconnection 22, which allows the first and second substrates 100 and 200 to be interconnected with external circuits, is exposed through the top of the second substrate 200, and metal/silicon composite layers 24 and 25 for co-melt bonding are formed at the lower part of the second substrate 200.

Also, a suspension structure 13 formed of a second polysilicon is suspended over the groove portion at the center of the first substrate 100, which permits the suspension structure to vibrate, and the metal/silicon composite layer 25 formed at the lower part of the second substrate 200 contributes to vacuum sealing the cavity 150 between the first and second substrates 100 and 200. In FIG. 2, reference numeral 11 represents a passivation layer of the first substrate 100, reference numeral 12 represents an electrode pad for interconnection formed of a first polysilicon, reference numeral 21 represents a first passivation layer of the second substrate 200, and reference numeral 23 represents a second passivation layer of the second substrate 200.

The first and second substrates 100 and 200 are formed of a bulk silicon, and protective layers such as the passivation layers 11 and 21 are formed of silicon oxide or nitride on the first and second substrates 100 and 200. The microgyroscope suspension structure 13 is formed over the first substrate 100 by a micro machining technique, and the cavity 150 is evacuated to a desired vacuum level, for example, down to $10^{-6}$ torr. The metal/silicon composite layer 24 for sealing the cavity 150 between the first and second substrates 100 and 200 is formed of an Au-Si composite layer.

A method for fabricating such a greater vacuum microgyroscope package having the above structure will now be described with reference to FIGS. 3A through FIG. 5. First, the fabrication of a suspension structure in the first substrate will be described with reference to FIGS. 3A through 3E. In particular, FIG. 3A is a sectional view of the first substrate for the microgyroscope according to the present invention after the space for a suspension structure has been etched and a passivation layer has been formed on and underneath the first substrate, FIG. 3B is a sectional view of the first substrate with a first polysilicon pattern on the passivation layer, FIG. 3C is a sectional view of the first substrate after a sacrificial layer has been formed on the structure of FIG. 3B, FIG. 3D is a sectional view of the first substrate with a suspension structure pattern formed on the sacrificial layer with a second polysilicon pattern, and FIG. 3E is a sectional view of the first substrate with a completed suspension structure obtained by etching away the sacrificial layer.

Figure 3A:
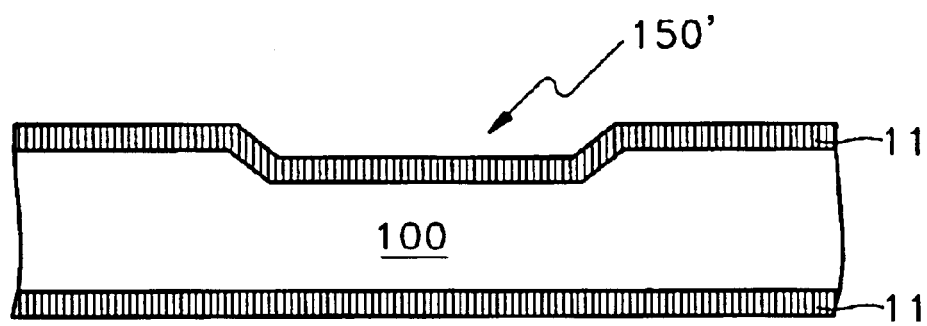
FIGS. 3A through 3E are sectional views of successive stages of the fabrication of a suspension structure on the first substrate for the microgyroscope in FIG. 2.

Initially, as shown in FIG. 3A, the center area of one surface of the first substrate 100 formed of silicon is etched to secure a groove portion 150' where the suspension structure for a microgyroscope is to be formed. Then, the passivation layer 11 is formed as a protective layer of the first substrate 100 on the top and bottom of the first silicon wafer 100 with an oxide or nitride film.

Figure 3B:
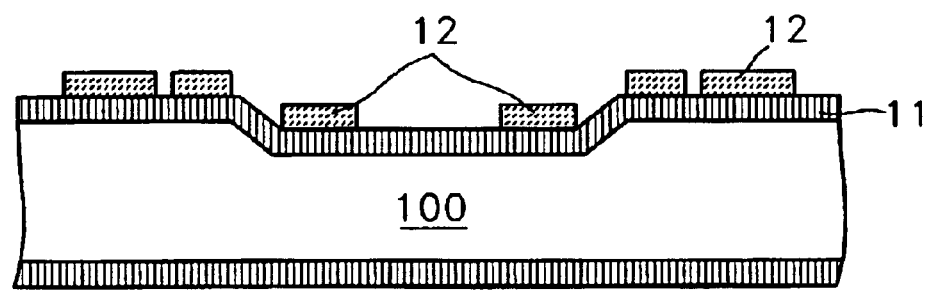
Figure 3C:
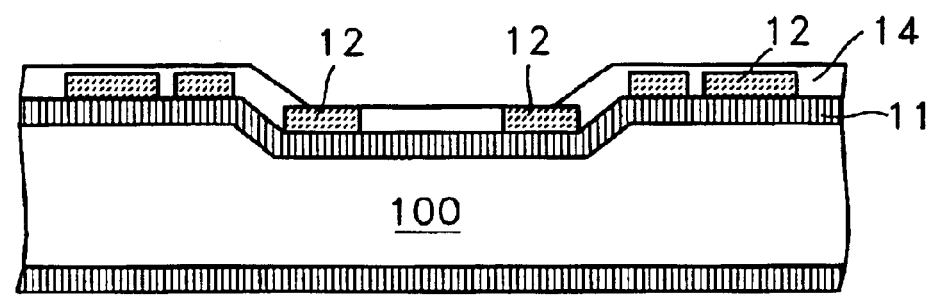
Figure 3D:
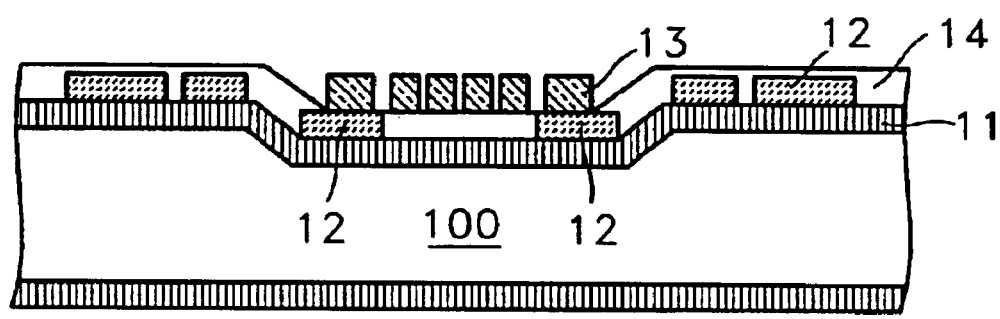
Figure 3E:
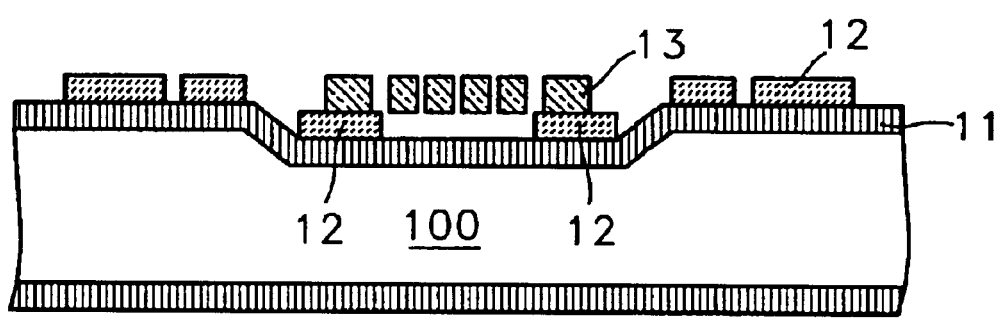

Next, as shown in FIG. 3B, a first polysilicon layer is coated on the passivation layer 11 and patterned into inner and outer electrode pads 12. Then, a sacrificial layer (PSG) 14 is deposited to cover the polysilicon electrode pads 12, as shown in FIG. 3C, and then patterned to expose a portion of the electrode pads 12 which will be an anchor for sustaining the suspension structure. Then, as shown in FIG. 3D, a second polysilicon layer is deposited on the resultant structure and patterned to form the suspension structure 13. Then, the sacrificial layer 14 is removed from the structure by dry and wet etching, resulting in the complete suspension structure 13 shown in FIG. 3E.

Figure 4A:
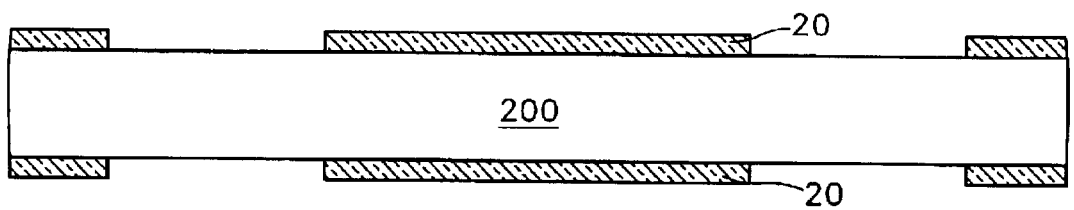
FIGS. 4A through 4E are sectional views of successive stages of the fabrication of a structure on the second substrate for the microgyroscope in FIG. 2.
Figure 4B:
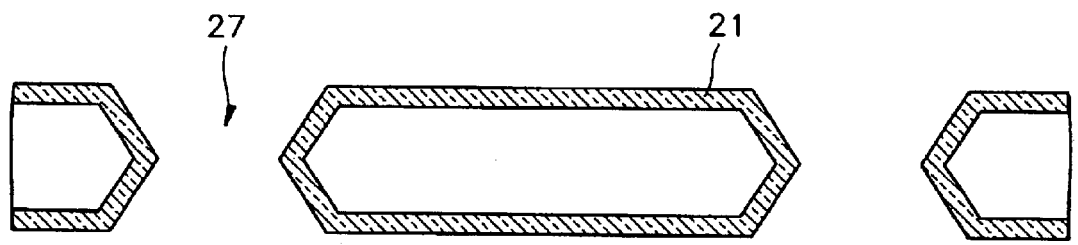
Figure 4C:
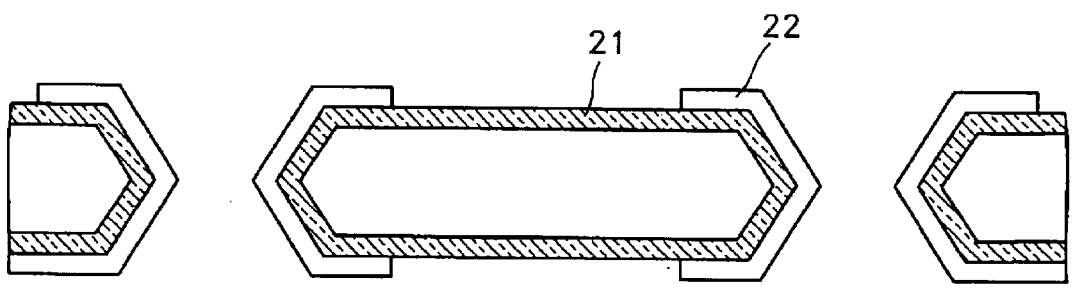
Figure 4D:
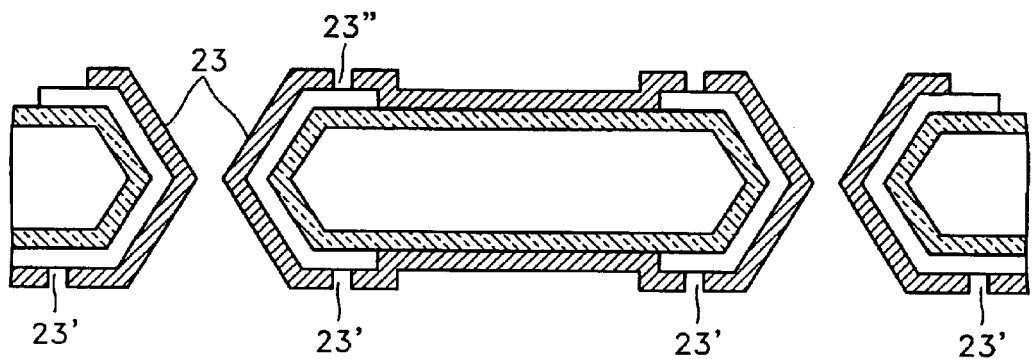
Figure 4E:
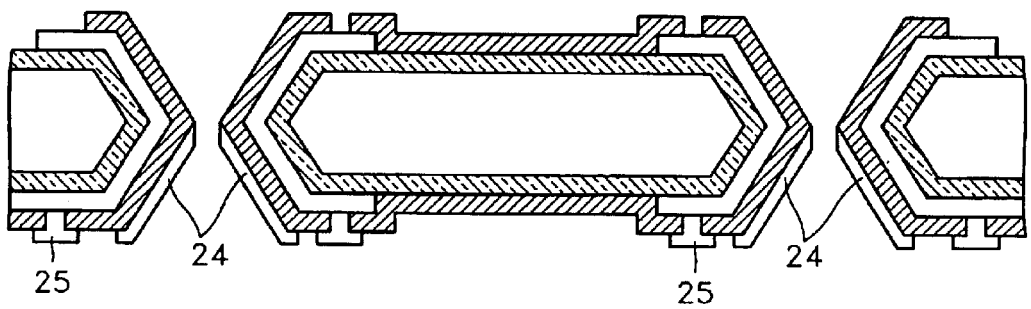

With reference to FIGS. 4A through 4E, the fabrication of a second substrate structure with a signal processing circuit will now be described. In particular, FIG. 4A is a sectional view of the second substrate for the microgyroscope according to the present invention, with an oxide pattern on the top and bottom of the same, FIG. 4B is a sectional view of the second substrate after patterned and surrounded by a first passivation layer as a protective layer against etching, FIG. 4C is a sectional view of the second substrate further having a metal pattern or polysilicon interconnect, FIG. 4D is a sectional view of the second substrate further having a second passivation layer formed to surround almost all of the first passivation layer and the polysilicon interconnect, FIG. 4E is a sectional view of the second substrate further having metal/silicon composite layers at the lower part thereof.

Referring to FIG. 4A, the second substrate 200, which includes a signal processing circuit (not shown) for detecting the motion of the suspension structure 13 (see FIG. 3E) of the microgyroscope, is prepared, and an oxide layer is coated thereon and patterned into an oxide pattern 20.

Then, the second substrate 200 is isotropically etched using the oxide pattern 20 as an etching mask to form through holes 27 through which connection will be made with the outside. The oxide pattern 20 is removed and the first passivation layer 21 is formed to completely surround the resulting second substrate, as shown in FIG. 4B.

Then, as shown in FIG. 4C, a polysilicon layer is deposited on the first passivation layer 21 of the second substrate 200 by low pressure chemical vapor deposition (LPCVD) and then patterned, resulting in the polysilicon interconnect 22.

Then, as shown in FIG. 4D, a silicon oxide layer is coated on the polysilicon interconnect 22 and the first passivation layer 21 by plasma enhanced chemical vapor deposition (PECVD) and patterned to form the second passivation layer 23 having an opening 23' for electrode pads as an opening 23" as a passage for connection to external circuits.

Then, as shown in FIG. 4E, the outer and inner metal/Si composite layers 24 and 25 for interconnection and vacuum packaging are formed. The outer metal/Si composite layer 24 is for sealing the cavity 150 (see FIG. 2) between two substrates. The inner metal/Si composite layer 25 is adhered to the electrode pad 12 of the first substrate 100 by melting, which allows the interconnection between the electrodes of the suspension structure 13 of the first substrate 100 and the ASIC circuit of the second substrate 200 to be connected to the outside.

Figure 5:
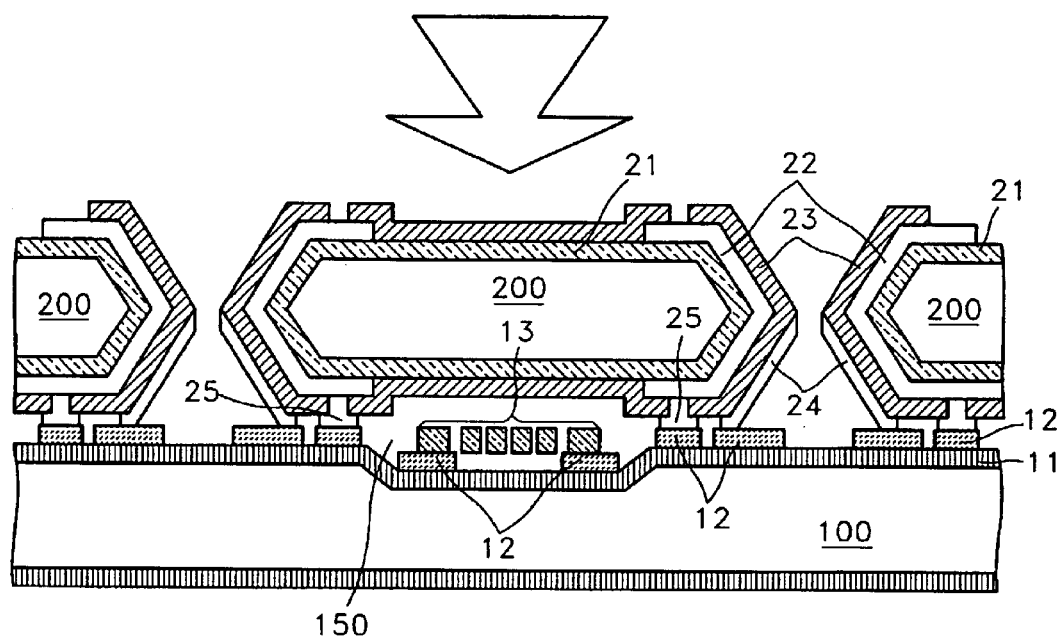
FIG. 5 is a sectional view of a completed microgyroscope according to the present invention, obtained by sealing the first substrate with the suspension structure of FIG. 3E and the second substrate with a composite layer for interconnection and vacuum packaging by anodic bonding.

Finally, as shown in FIG. 5, the electrode pads 12 on the first substrate 100 are adhered to the metal/Si composite layers 24 and 25 of the second substrate 200 by a co-melting reaction at low temperatures, such that the first and second substrates 100 and 200 are vacuum sealed while the suspension structure 13 is suspended in a vacuum condition, resulting in a completed device.

Figure 6A:
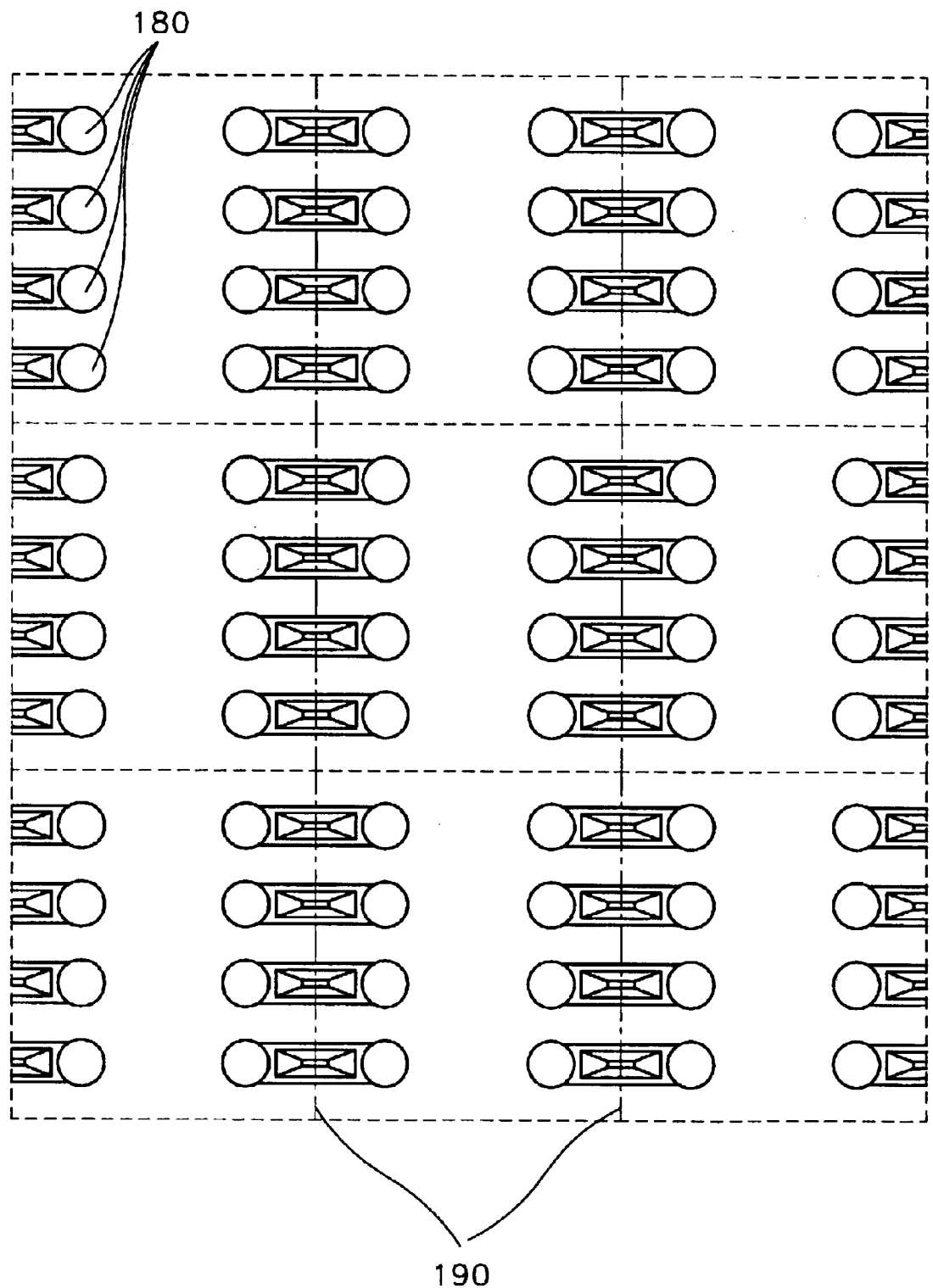
FIGS. 6A and 6B show top and sectional views of a wafer having multiple microgyroscopes according to the present invention.
Figure 6B:
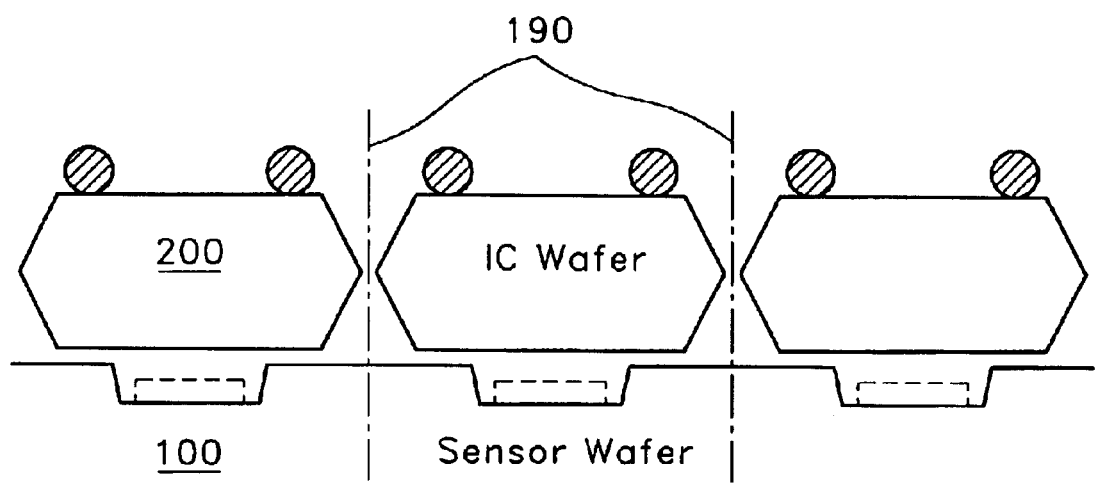

In manufacturing, many microgyroscopes, which have the configuration mentioned above, are simultaneously formed on a single wafer, as shown in FIGS. 6A and 6B. FIGS. 6A and 6B show top and sectional views of the wafer having multiple microgyroscopes according to the present invention, respectively. In FIGS. 6A and 6B, reference numeral 180 represents a ball for bonding a flip chip and reference numeral 190 represents a dicing line.

The principle of the high vacuum packaged microgyroscope having the above configuration is as follows. Briefly, the electrode pads 12 of the first substrate 12 and the outer and inner metal/Si composite layers 24 and 25 of the second substrate 200 are melted and cooled using the co-melting properties to seal the cavity 150 therein. At the same time, the interconnections between the electrodes of the suspension structure 13 of the first substrate and the ASIC driving circuit (not shown) of the second substrate 200 are extracted to the outside. The co-melting bonding refers to a kind of bonding technique in which two materials having high but different melting points are melted and bonded at a temperature lower than the melting points. For example, the melting point of gold (Au), which is a commonly used metal, is 1063° C. and the melting point of Si is 2410° C. However, when these two materials, Au and Si, contact, they can melt at 363° C. Thus, before the vacuum sealing of the first and second substrates 100 and 200, the first and second substrates 100 and 200 are maintained at 350° C., which is high enough to remove a variety of organic substances, for example, gases adsorbed onto the surface of a thin film, such as oxygen, nitrogen and carbon dioxide, for degassing, and then two substrates 100 and 200 are melted and bonded at 363 to 400° C. This melting and bonding process according to the present invention can exclude the degassing of impurities, which is usually performed for a long period of time after such a bonding, and the inner pressure of the space between the first and second substrates 100 and 200 becomes near vacuum levels in the vacuum chamber. In addition, the electrodes of the suspension structure 13 or the electrodes of the ASIC can be extracted to the top of the second substrate 200 through the polysilicon interconnection 22 of the second substrate 200.

As described above, in the high-vacuum packaged microgyroscope according to the present invention, a substrate with an ASIC circuit for signal processing is mounted onto another substrate including the suspension structure of a microgyroscope in the form of a flip chip. Also, the electrodes of the suspension structure and the ASIC circuit can be exposed to the outside through the polysilicon interconnection interposed between double passivation layers. The short interconnection between the suspension structure and the ASIC circuit can reduce the device in size and prevents generation of noise, thereby increasing signal detection sensitivity.

Also, by sealing two substrates at low temperatures, for example, at 363 to 400° C. using the co-melting reaction between metal, for example, Au, and Si in a vacuum, the degree of vacuum in the device increases. Also, additional processes, such as wire bonding and die bonding, are not required, the manufacturing cost decreases and the size of the product decreases in the order of several square millimeters. This contributes to reducing the size and weight of micro system related applications. In addition, when the first and second substrates are electrically connected and grounded, inflow or outflow of the electric field can be blocked and the generation of noise due to elongated interconnections can be avoided, thereby increasing a signal detection sensitivity.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for manufacturing a high-vacuum packaged microgyroscope, comprising the steps of:

(a) etching a first substrate to form a groove cavity at the center of the first substrate, where a suspension structure is to be formed, and forming a first passivation layer for protecting the first substrate;

(b) depositing a polysilicon layer on the etched surface of the first substrate and patterning the polysilicon layer into inner and outer electrode pads;

(c) forming a suspension structure by depositing a sacrificial layer over the inner and outer electrode pads, patterning the sacrificial layer to form openings to be anchors for sustaining the suspension structure, depositing polysilicon over the opening and the sacrificial layer and patterning the deposited polysilicon layer;

(d) removing the sacrificial layer by etching to float the suspension structure;

(e) forming an oxide pattern on a second substrate having a signal processing circuit for sensing the motion of the suspension structure;

(f) patterning the second substrate using the oxide pattern as an etching mask to form through holes for interconnection to the outside, removing the oxide pattern, and forming a first passivation layer for protecting the entire surface of the second substrate;

(g) forming an interconnect by depositing a polysilicon layer to cover both sides and the top and bottom edges of the second substrate surrounded by the first passivation layer, and patterning the polysilicon layer;

(h) depositing a second passivation layer to cover the interconnect and the second substrate and patterning the second passivation layer to form openings for interconnection to the outside;

(i) forming inner metal/semiconductor composite layers for connection through the openings to the interconnect, and outer metal/semiconductor composite layer for vacuum packaging on the second passivation layer; and (j) vacuum sealing the first and second substrates by co-melting bond between the inner electrode pads of the first substrate and the inner metal/semiconductor composite layers, and between the outer electrode pads of the first substrate and the outer metal/semiconductor composite layers of the second substrate, to maintain the cavity of the suspension structure in a vacuum condition.

2. The method of claim 1, wherein in the step (b) the inner and outer electrode pads of the suspension structure are formed of a polysilicon layer, a polysilicon/gold (Au) composite layer, or a polysilicon/aluminum (Al) composite layer.

3. The method of claim 1, wherein in the step (g) the polysilicon is deposited by low pressure chemical vapor deposition (LPCVD).

4. The method of claim 1, wherein in the step (h) the second passivation layer is deposited by plasma enhanced chemical vapor deposition (PECVD).

5. The method of claim 1, wherein in the step (i), the inner and outer metal/semiconductor composite layers are formed of a AU/Si or Al/Si composite layer.

6. The method of claim 1, wherein in the step (j), the melting and bonding are performed at a low temperature of 363 to 400° C.

7. The method of claim 1, wherein in the step (j) the degree of vacuum in the cavity reaches down to $10^{-6}$ torr.

* * * * *